United States Patent [19]

Segars

[11] Patent Number: 5,757,819
[45] Date of Patent: May 26, 1998

[54] INTEGRATED CIRCUIT TEST CONTROLLER

[75] Inventor: Simon Anthony Segars, Cambridge, United Kingdom

[73] Assignee: Advanced Risc Machines Limited, United Kingdom

[21] Appl. No.: 758,292

[22] Filed: Dec. 3, 1996

Related U.S. Application Data

[63] Continuation of Ser. No. 414,571, Mar. 31, 1995, abandoned.

[30] Foreign Application Priority Data

Jul. 1, 1994 [GB] United Kingdom ............... 9413222

[51] Int. Cl.$^6$ ............................................. G01R 31/28
[52] U.S. Cl. ................................. 371/22.32; 371/22.5
[58] Field of Search ........................... 371/22.3, 22.5, 371/22.6, 22.31, 22.32, 24, 25.1; 395/183.06, 182.05; 364/550; 324/763–765

[56] References Cited

U.S. PATENT DOCUMENTS

| | | | |
|---|---|---|---|
| 5,109,190 | 4/1992 | Sakashita et al. | 324/158 R |
| 5,260,949 | 11/1993 | Hashizume et al. | 371/22.3 |
| 5,281,864 | 1/1994 | Hahn et al. | 307/272.2 |
| 5,333,139 | 7/1994 | Sturges | 371/22.3 |
| 5,448,576 | 9/1995 | Russell | 371/22.3 |
| 5,457,699 | 10/1995 | Bode et al. | 371/22.3 |
| 5,477,493 | 12/1995 | Danbayashi | 365/201 |
| 5,487,074 | 1/1996 | Sullivan | 371/22.3 |

FOREIGN PATENT DOCUMENTS

WO 84/02580  7/1984  WIPO ............. G01R 15/12

*Primary Examiner*—Robert W. Beausoliel, Jr.
*Assistant Examiner*—Nadeem Iqbal
*Attorney, Agent, or Firm*—Fenwick & West LLP

[57] ABSTRACT

An integrated circuit 2 implementing JTAG debugging and analysis functions has an IDCODE Instruction which returns predetermined data characteristic of the integrated circuit, e.g. manufacturer, part number and version. A portion 20 of the serial test scan chain of the integrated circuit 2 is reused to load and then serially output this identifying data. The serial input of the test and debugging system is connected during such IDCODE Instructions to the start of the portion 20 of the serial test scan chain. This enables the identifying data of a plurality of integrated circuits with linked serial test scan chains to successively output their identifying data in one operation.

6 Claims, 3 Drawing Sheets

INTEGRATED CIRCUIT TEST CONTROLLER

This is a continuation of application Ser. No. 08/414,571, filed on Mar. 31, 1995 now abandoned.

BACKGROUND OF THE INVENTION

1. Field of the Invention

This invention relates to the field of integrated circuits. More particularly, this invention relates to integrated circuits having serial test scan chains of the type used for debugging and analysing integrated circuit operation.

2. Description of the Prior Art

It is known from the JTAG system described in IEEE Standard 1149.1-1990 to provide an integrated circuit with a serial test scan chain for applying signals to and capturing signals from predetermined points within an integrated circuit. An example of such an arrangement is illustrated in FIG. 1 of the accompanying drawings.

FIG. 1 shows an integrated circuit 2 having a block of core logic 4 for performing the desired operation functions of the integrated circuit 2. For example, if the integrated circuit 2 is a microprocessor, then the core logic 4 could be a processor core and associated cache memory, co-processor, memory management unit and the like that are used when the integrated circuit 2 is operating normally to achieve its desired functions. The core logic 4 is surrounded by a serial test scan chain 6.

The serial test scan chain 6 is composed of a plurality of scan chains cells. Each scan chain cell can either apply a signal value, capture a signal value or be transparent relative to a predetermined point within the integrated circuit 2 to which it is coupled. The scan chain cells are connected together in a manner similar to a shift register, whereby signals to be applied or signals that have been captured can be shifted in or shifted out of the serial test scan chain 6.

The serial test scan chain 6 operates under control of a scan chain controller 8. The scan chain controller 8 has a test access port connecting it to elements outside of the integrated circuit 2. The test access port has five signal lines, i.e. a test data output line (TDO), a test data input line (TDI), a test mode selecting line (TMS), a test clock line (TCK) and an active low test reset line (nTRST). The TDI line acts as a serial input, the TDO line acts as a serial output, the TCK line supplies the clock signal based upon which all test and analysis operations proceed and the nTRST line supplies a reset signal using which the test system can be forced to return to a predetermined known state. The TMS line supplies a mode signal which moves a state machine 10 within the scan chain controller 8 between states. Dependent upon the current state of the state machine 10, control logic 12 within the scan chain controller 8 operates to configure the test systems in different ways, e.g. there will be states in which a serial test instruction is received, serial test data is received, serial test data is output, instructions that have been received are acted upon etc. Depending upon the particular state of the scan chain controller 8, a multiplexer 14 within the scan chain controller 8 serves to connect different points within the integrated circuit 2 to the TDO line.

One instruction implemented by the scan chain controller 8 is the IDCODE instruction that is described within the IEEE Standard 1149.1-1990. 1 Upon receipt of this instruction, the scan chain controller serves to output on the TDO line a series of bits that comprise identifying data that characterises the particular integrated circuit 2. Such a feature can be extremely useful in a debugging environment in which it is vitally important to know exactly what integrated circuit is being dealt with including its part number and the precise version of that part. This function is achieved by providing a shift register 16 into which the identifying data is loaded upon receipt of an IDCODE instruction and from where it is output to the TDO line via the multiplexer 14.

It is strongly advantageous within the field of integrated circuits to reduce the number of circuit elements within an integrated circuit. An integrated circuit having fewer components is generally easier to manufacture, less expensive, consumes less power and allows greater flexibility for the provision of circuit elements to provide other functions.

SUMMARY OF THE INVENTION

An object of the invention is to provide an integrated circuit with a reduced number of circuit elements whilst maintaining the functionality of the integrated circuit.

Viewed from one aspect this invention provides an integrated circuit comprising:

(i) a circuit unit for performing an operational function within said integrated circuit;

(ii) a serial test scan chain coupled to said circuit unit for capturing signals from and applying signals to predetermined points within said circuit unit; and (iii) a scan chain controller for controlling test operation of said serial test scan chain and having a serial data input for input of serial data from outside of said integrated circuit and a serial data output for output of serial data to outside of said integrated circuit, (iv) wherein said scan chain controller is responsive to an identifying-data-requesting-instruction input via said serial data input to control loading of predetermined identifying data characteristic of and stored within said integrated circuit into a portion of said serial test scan chain and to control serial output via said serial data output of said identifying data from said portion of said serial test scan chain.

The invention recognises and exploits the potential of the serial test scan chain to also serve as a mechanism for handling the output of the identifying data. Accordingly, in the example illustrated in FIG. 1, the shift register 16 is no longer required. The integrated circuit area needed to implement the shift register 16 might typically account for 30% of the area of the scan chain controller 8 and so the invention provides a significant reduction in the circuit area required for debugging and analysis purposes. A comparatively small increase in the number of other components of the scan chain controller 8 is required in order to switch an appropriate portion of the serial test scan chain 6 for use in outputting the identifying data, but this is outweighed by the saving in not having to provide a dedicated shift register.

The invention provides an additional advantage in embodiments in which said scan chain controller includes a multiplexer for connecting one of a plurality of points within said integrated circuit to said serial data output.

By removing the requirement for a dedicated shift register, it is possible to utilise a multiplexer having one fewer channel. This saves on circuit area and yields further of the advantages discussed above.

The identifying data could take many forms. However, it is usual and highly useful that the identifying data includes one or more of:

data identifying a manufacturer of said integrated circuit;

data identifying a part number of said integrated circuit; and data identifying a version number for said integrated circuit.

It will be appreciated that the identifying data will usually be provided by the manufacturer of the integrated circuit. In this case the identifying data is stored within non-volatile storage within the integrated circuit.

The non-volatile storage could take the form of fusible links, read only memory or a series of connections to one or other of the voltage rail or ground rail depending upon the bit of data to be represented (i.e. the data may be hardwired into the IC).

Preferred embodiments of the invention further comprise an input multiplexer for connecting said portion of said serial test scan chain into which said identifying data is loaded to one of said serial data input or an output of a portion of said serial test scan chain immediately preceding said portion into which said identifying data is loaded, said input multiplexer switching to connect to said serial data input in response to said identifying-data-requesting-instruction.

The input multiplexer provides the ability to chain together the portions of the serial test scan chains from different ICs that will shift out the identifying data and so make possible the recovery of identifying data from a plurality of ICs in one operation.

Viewed from another aspect this invention provides a method of operating an integrated circuit, said method comprising the steps of:

(i) performing an operational function with a circuit unit within said integrated circuit;

(ii) capturing signals from and applying signals to predetermined points within said circuit unit using a serial test scan chain coupled to said circuit unit for;

(iii) controlling test operation of said serial test scan chain with a scan chain controller having a serial data input for input of serial data from outside of said integrated circuit and a serial data output for output of serial data to outside of said integrated circuit; and (iv) in response to an identifying-data-requesting-instruction input via said serial data input, loading predetermined identifying data characteristic of and stored within said integrated circuit into a portion of said serial test scan chain and serially outputting said identifying data via said serial data output from said portion of said serial test scan chain.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
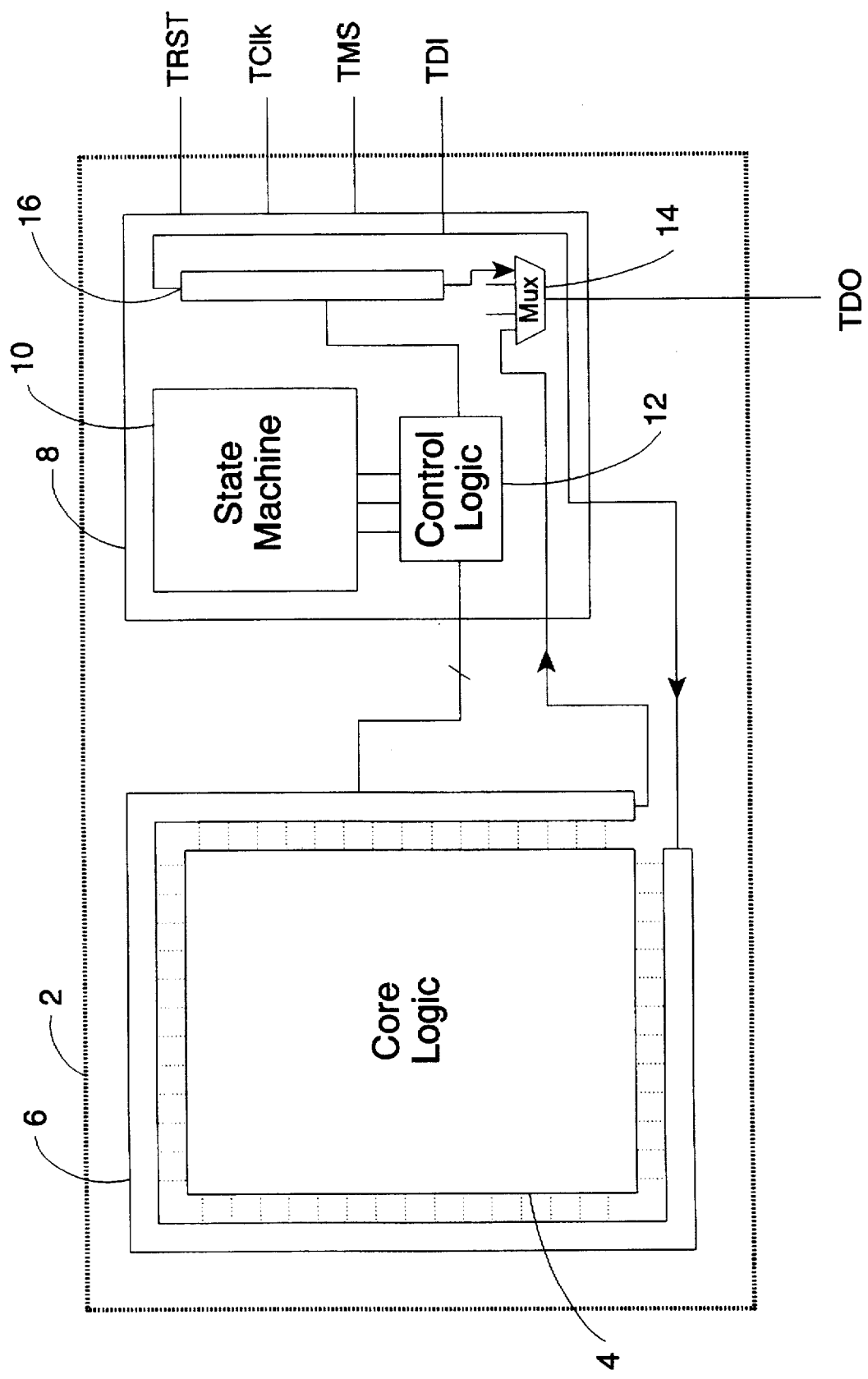
FIG. 1 illustrates an integrated circuit having a debugging and analysis system.
Figure 2:
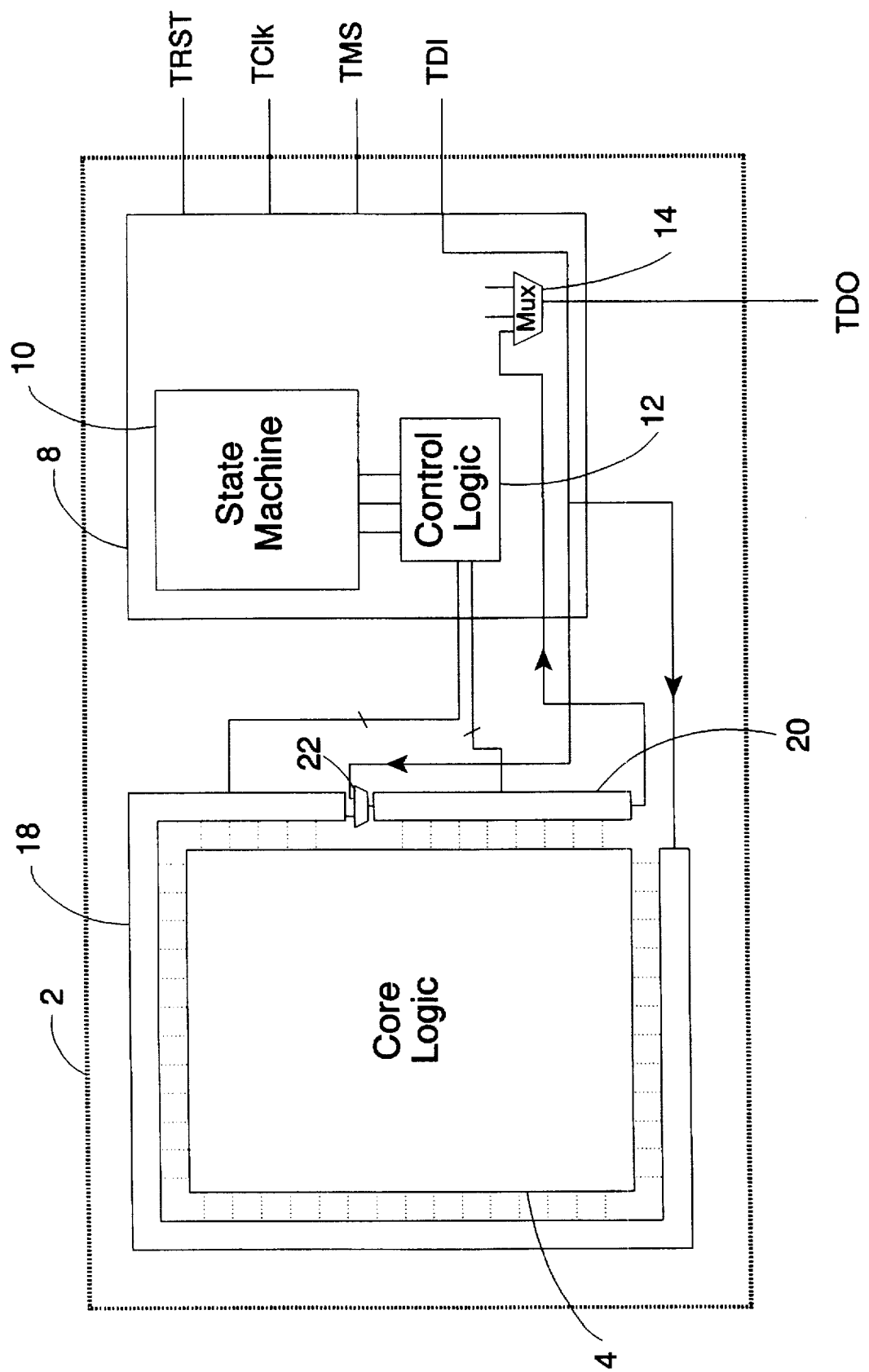
FIG. 2 illustrates an integrated circuit having a debugging and analysis system in which the serial test scan chain is re-used as a mechanism for outputting identifying data characteristic of the integrated circuit.

FIG. 2 illustrates an integrated circuit 2 having core logic 4 and a serial test scan chain having a first portion 18 and a second portion 20. A scan chain controller 8 controls the operation of the serial test scan chain. The operation of the debugging and analysis system is essentially the same as that for FIG. 1 as previously discussed other than in relation to the IDCODE instruction.

Upon receipt of an IDCODE instruction, the control logic 12 within the scan chain controller 8 outputs a signal to the second portion 20 of the serial test scan chain to trigger the second portion 20 to load the identifying data relating to the manufacturer, part number and version number of the integrated circuit 2 (typically 32 bits of data). Once this data has been loaded into the second portion 20, it is serially clocked out under control of the debugging clock TCK via the multiplexer 14 onto the TDO line. In this way, a dedicated shift register does not have to be provided within the scan chain controller for this purpose and the multiplexer 14 can be made to have one channel fewer.

An input multiplexer 22 is connected between the first portion 18 and the second portion 20 of the serial test scan chain. This input multiplexer 22 serves to direct data received on the TDI line to the second portion 20 during the action of an IDCODE instruction. This ensures that after the identifying data has been shifted out, any data shifted into the scan chain passes straight through after the delay of the second portion 20. This is significant when the serial test scan chains of a plurality of discrete integrated circuits are connected together to enable the identifying data for all the integrated circuits to be recovered in sequence by clocking the data through successive second portions 20 of the serial test scan chains of each integrated circuit.

Figure 3:
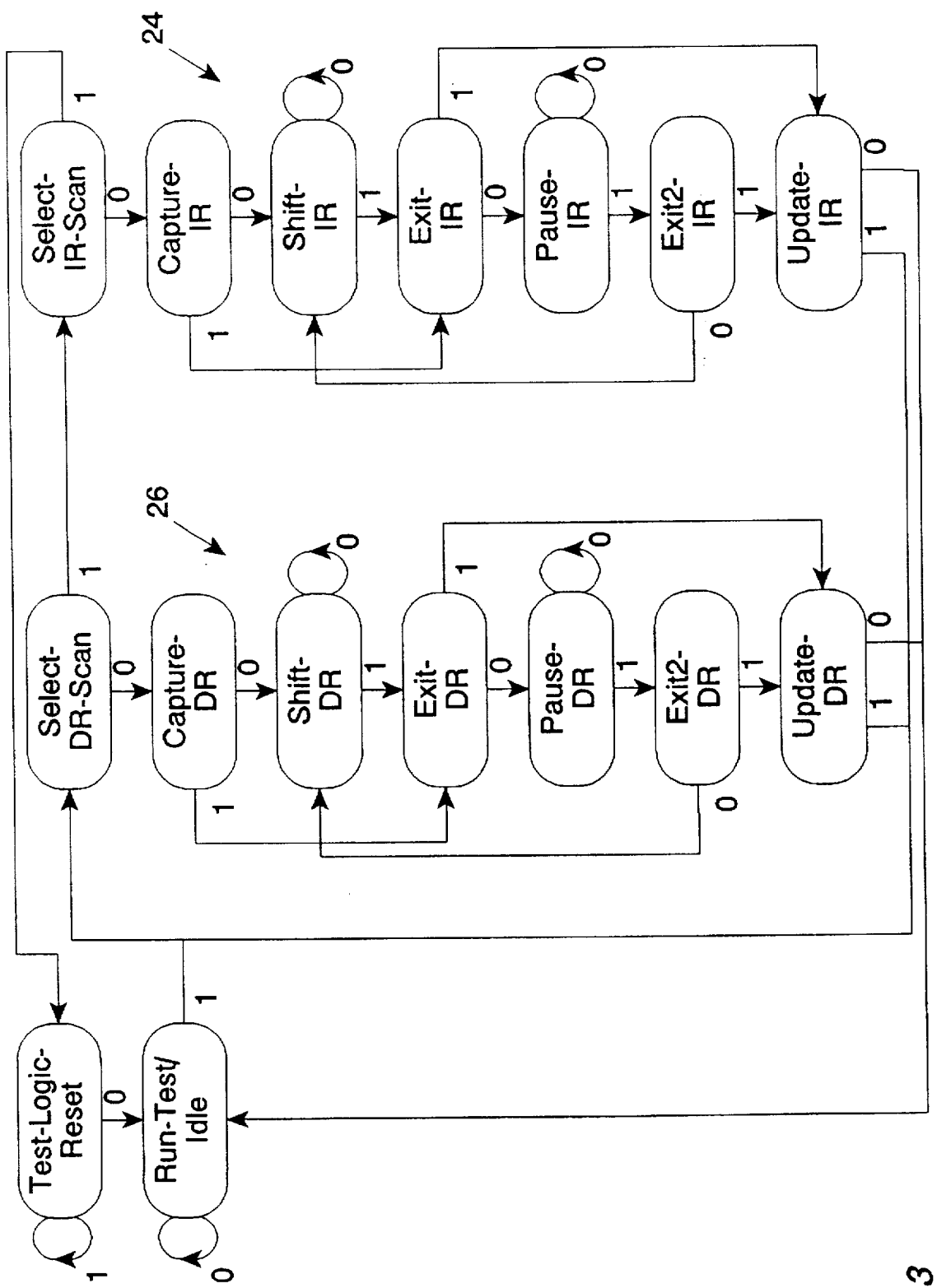
FIG. 3 illustrates a state diagram for a state machine within a scan chain controller.

FIG. 3 illustrates the states through which the state machine 10 may be passed in accordance with the JTAG standard. Broadly speaking, the states can be considered as having an instruction capturing and interpretation section 24 and a data capturing and interpretation section 26. The manner in which the identifying-data-requesting-instruction IDCODE is handled relative to this state diagram can be described with reference to Table 1.

TABLE 1

| Action/State | Mode Bit Required | Data In Bits Received |
|---|---|---|
| Start at Test-Logic-Reset State | N/A | N/A |
| Move to Capture-IR State | 0110 | **** |
| Cycle around Shift-IR State to receive IDCODE Instruction | 0000 | 1110 |
| Move to Update-IR State; Activate Instruction Decoder | 1011 | **** |
| Move to Capture-DR State; Load 2nd Portion and Switch Input Mux | 10 | ** |
| Cycle around Shift-DR State to output Identifying Data | 32 × '0' | 32 × '*' |
| Return to Run-Test/Idle State | 10110 | ***** |

The state machine 10 starts in the Test-Logic-Reset State, it being unimportant what mode bits or received data bits have proceeded that state. The state machine 10 is then moved through the state diagram illustrated in FIG. 3 to the Capture-IR State. The mode bit sequence required to achieve this is "0110". During this move to the Capture-IR State, it is unimportant what bits are present on the TDI line. The state machine 10 then cycles four times through the Shift-IR State to receive the IDCODE Instruction. The mode bits required to achieve this are "0000" and the bits that will be captured from the TDI line during this cycling to specify the IDCODE Instruction will be "1110". After the IDCODE Instruction has been captured and stored, the state machine 10 moves to the Update-IR State by receipt of modes bits "1011". As the state machine 10 passes through the Update-IR State, it generates a signal that activates an instruction decoder and makes the IDCODE Instruction the current instruction active within the scan chain controller 8.

The state machine 10 is then moved to the Capture-DR State by received mode bits "10". The control logic 12 then generates signals supplied to the second portion 20 of the serial test scan chain and the input multiplexer 22 to trigger the loading of the identifying data from hardwired non-volatile storage into the second portion 20 of the serial test scan chain and to switch the input multiplexer 22 to select the TDI line as its input. The state machine 10 then cycles for 32 clock periods about the Shift-DR State by application of 32 successive "0" bits to the TMS line. During this period the identifying data is clocked out of the second portion 20 of the serial test scan chain onto the TDO line via the multiplexer 14. The switched state of the input multiplexer 22 ensures and data applied to TDI is passed straight through the second portion 20 after the associated delay. In particular, if another integrated circuit is also in the identifying data output state, then its identifying data will be clocked into the uppermost part of the second portion 20 of the serial test scan chain and be available to be immediately output on the TDO line if more than 32 cycles through the Shift-DR State are made. Once all the identifying data that is desired has been recovered, the state machine is returned to the Run-Test/Idle State by application of mode bits "10110".

The IDCODE instruction is the default active instruction for the scan chain controller 8 following a reset. In this way, when starting from the Test-Logic-Reset State it is possible if so desired to move directly to the Capture-DR State relying upon the IDCODE instruction being active by default. In order to achieve this the mode bits "010" would be applied. Thereafter, the process would proceed as described in relation to the last three rows of Table 1.

It will be appreciated that the second portion 20 of the serial test scan chain could have any length, a greater length allowing more complex identifying data. It will also be appreciated that the portion of the serial test scan chain that is used for loading the identifying data and clocking it out from the integrated circuit need not necessarily be at the end of the serial test scan chain. If the portions so used is in the middle of the serial test scan chain, then a connection needs to be made from the end of that portion to the multiplexer 14.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. An integrated circuit comprising:
   (i) a circuit unit for performing an operational function within said integrated circuit;
   (ii) a serial test scan chain formed of a plurality of scan chain cells including a first portion consisting of thirty-two scan chain cells and a second portion including additional scan chain cells, said serial test scan chain being coupled to said circuit unit for capturing signals from and applying signals to predetermined points within said circuit unit; and
   (iii) a scan chain controller for controlling test operation of said serial test scan chain and having a serial data input for input of serial data from outside of said integrated circuit and a serial data output for output of serial data to outside of said integrated circuit;
   (iv) wherein said scan chain controller is responsive to an identifying-data-requesting-instruction input via said serial data input to control loading of predetermined identifying data characteristic of and stored within said integrated circuit into said first portion of said serial test scan chain and to control serial output via said serial data output of said identifying data from said first portion of said serial test scan chain; and further comprising;
   (v) a scan chain multiplexer disposed within said serial test scan chain and responsive to said identifying-data-requesting-instruction to connect said first portion of said serial test scan chain between said serial data input and said serial data output and to bypass said second portion including said additional scan chain cells of said serial test scan chain.

2. An integrated circuit as claimed in claim 1, wherein said scan chain controller includes a multiplexer for connecting one of a plurality of points within said integrated circuit to said serial data output.

3. An integrated circuit as claimed in claim 1, wherein said identifying data includes one or more of:
   data identifying a manufacturer of said integrated circuit;
   data identifying a part number of said integrated circuit; and
   data identifying a version number for said integrated circuit.

4. An integrated circuit as claimed in claim 1, wherein said identifying data is stored within non-volatile storage within said integrated circuit.

5. An integrated circuit as claimed in claim 1, wherein said scan chain multiplexer comprises an input multiplexer for connecting said first portion of said serial test scan chain into which said identifying data is loaded to one of said serial data input or an output of said second portion of said serial test scan chain immediately preceding said first portion into which said identifying data is loaded, said input multiplexer switching to connect to said serial data input in response to said identifying-data-requesting-instruction.

6. A method of operating an integrated circuit including a serial test scan chain formed of a plurality of scan chain cells including a first portion consisting of thirty-two scan chain cells and a second portion including additional scan chain cells, said method comprising the steps of:
   (i) performing an operational function with a circuit unit within said integrated circuit;
   (ii) capturing signals from and applying signals to predetermined points within said circuit unit using said serial test scan chain coupled to said circuit unit for;
   (iii) controlling test operation of said serial test scan chain with a scan chain controller having a serial data input for input of serial data from outside of said integrated circuit and a serial data output for output of serial data to outside of said integrated circuit;
   (iv) in response to an identifying-data-requesting-instruction input via said serial data input, loading predetermined identifying data characteristic of and stored within said integrated circuit into said first portion of said serial test scan chain, and serially outputting said identifying data via said serial data output from said first portion of said serial test scan chain; and (v) in response to said identifying-data-requesting-instruction connecting said first portion of said serial test scan chain between said serial data input and said serial data output and bypassing said second portion of the scan chain cells not within said first portion of said serial test scan chain.

* * * * *